(12) United States Patent
Ooshita et al.

(10) Patent No.: US 7,592,778 B2
(45) Date of Patent: Sep. 22, 2009

(54) BATTERY PROTECTION IC CHIP

(75) Inventors: Kazuhiro Ooshita, Atsugi (JP); Akira Ikeuchi, Atsugi (JP); Itsuki Nakano, Atsugi (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 64 days.

(21) Appl. No.: 11/181,060

(22) Filed: Jul. 14, 2005

(65) Prior Publication Data
US 2006/0164041 A1    Jul. 27, 2006

(30) Foreign Application Priority Data
Jan. 27, 2005    (JP)    ............... 2005-020213

(51) Int. Cl.
*H02J 7/04* (2006.01)
*G01R 11/32* (2006.01)

(52) U.S. Cl. .................. 320/150; 324/134; 429/61; 429/65; 307/10.7

(58) Field of Classification Search .............. 320/150, 320/134; 324/134; 307/10.7; 429/61
See application file for complete search history.

(56) References Cited

U.S. PATENT DOCUMENTS

| 2003/0027036 A1* | 2/2003 | Emori et al. .................. 429/61 |
| 2004/0189259 A1* | 9/2004 | Miura et al. ................. 320/134 |
| 2004/0256738 A1* | 12/2004 | Pavier et al. ................ 257/778 |

FOREIGN PATENT DOCUMENTS
JP    2004 006524    1/2004

* cited by examiner

*Primary Examiner*—Adolf Berhane
*Assistant Examiner*—Yalkew Fantu
(74) *Attorney, Agent, or Firm*—Ladas & Parry LLP (57) ABSTRACT

A lithium-ion battery protection module is disclosed. The lithium-ion battery protection module includes a control IC chip. The control IC chip includes a discharge overcurrent detector, a charge overcurrent detector, and a temperature detector. The control IC chip is mounted on a charge control FET and a discharge control FET so as to highly accurately detect the temperature of the charge control FET and the discharge control FET.

4 Claims, 12 Drawing Sheets

BATTERY PROTECTION IC CHIP

BACKGROUND OF THE INVENTION

1. Field of the Invention

The present invention relates to a battery protection IC chip, and particularly relates to a battery protection IC chip that constitutes a battery pack protection circuit capable of preventing a lithium-ion battery used as a power source for a mobile device from overcharge, overdischarge, and overcurrent.

2. Description of the Related Art

Many mobile devices employ lithium-ion batteries in their battery packs. Lithium-ion batteries are likely to have troubles in the event of overcharge, overdischarge, and overcurrent. Therefore, battery packs for lithium-ion batteries are provided with battery protection modules including battery protection circuits that prevent lithium-ion batteries from overcharge, overdischarge, and overcurrent. Such a battery protection circuit has a FET chip serving as an electronic switch that opens in response to overcharge, overdischarge, and overcurrent. The battery protection module includes a COB (Chip On Board) structure in which chips and wires are encapsulated by a synthetic resin part, and a discrete module structure in which a packaged element is installed. The battery packs are repeatedly rechargeable by an associated recharger.

[Patent Document 1] Japanese Patent Laid-Open Publication No. 2004-6524

There is a high risk of trouble if an overcurrent is applied to a lithium-ion battery from a recharger during charging, or if an overcurrent is applied to a mobile device from a lithium-ion battery during use of the mobile device. It is therefore preferable from a safety standpoint to take some measures against these events. For example, because a FET chip generates heat in the case of overcurrent, detecting the temperature of the FET chip and turning off the FET chip when the temperature of the FET chip rises to a predetermined temperature may be one of the measures. It is desirable to provide such a measure with no increase in production costs of battery protection modules, no additional parts, and a high detection accuracy.

SUMMARY OF THE INVENTION

In view of the forgoing, it is an object of the present invention to provide a battery IC chip.

The present invention provides a battery protection IC chip that comprises a protection section for protecting a battery during charging and discharging, and a temperature detector for detecting an ambient temperature, wherein the protection section is configured to turn off a charge control FET chip and a discharge control FET chip in response to a detection by the temperature detector of the ambient temperature reaching a predetermined temperature.

According to the present invention, the battery protection IC chip is mounted on the charge control FET chip and the discharge control FET chip. As the battery protection IC chip is adjacent to the charge control FET chip and the discharge control FET chip, the temperature detector can accurately detect the temperature of the charge control FET chip and the discharge control FET chip.

DETAILED DESCRIPTION OF THE PREFERRED EMBODIMENT

The following description provides exemplary embodiments of the present invention with reference to the accompanying drawings.

First Embodiment

Figure 1:
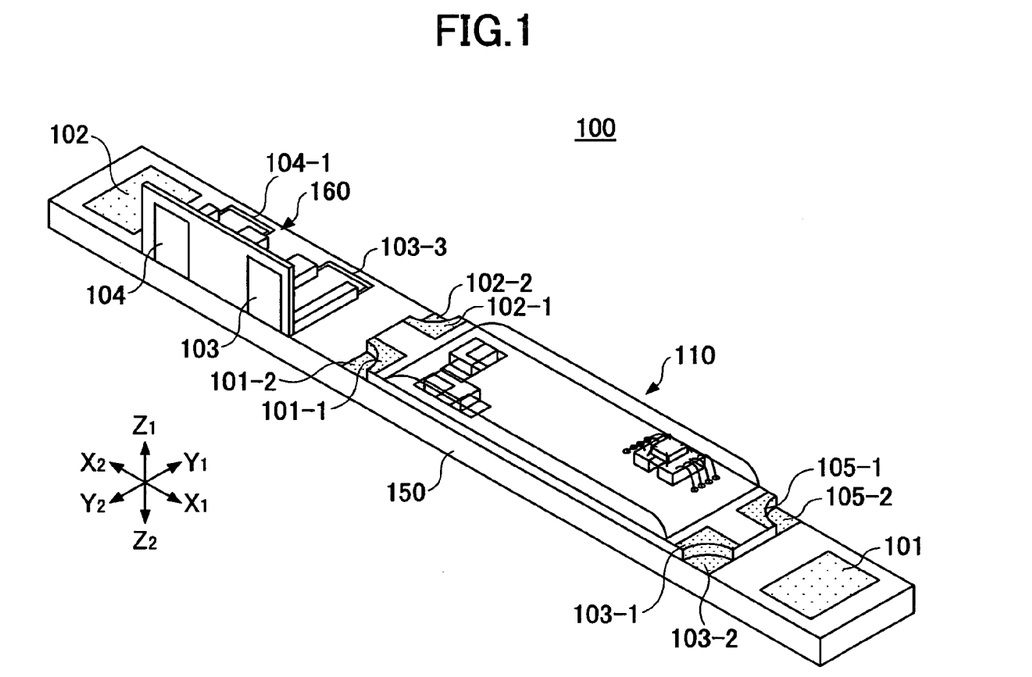
FIG. 1 is a perspective view illustrating a battery protection device comprising a battery protection module according to a first embodiment of the present invention.
Figure 2:
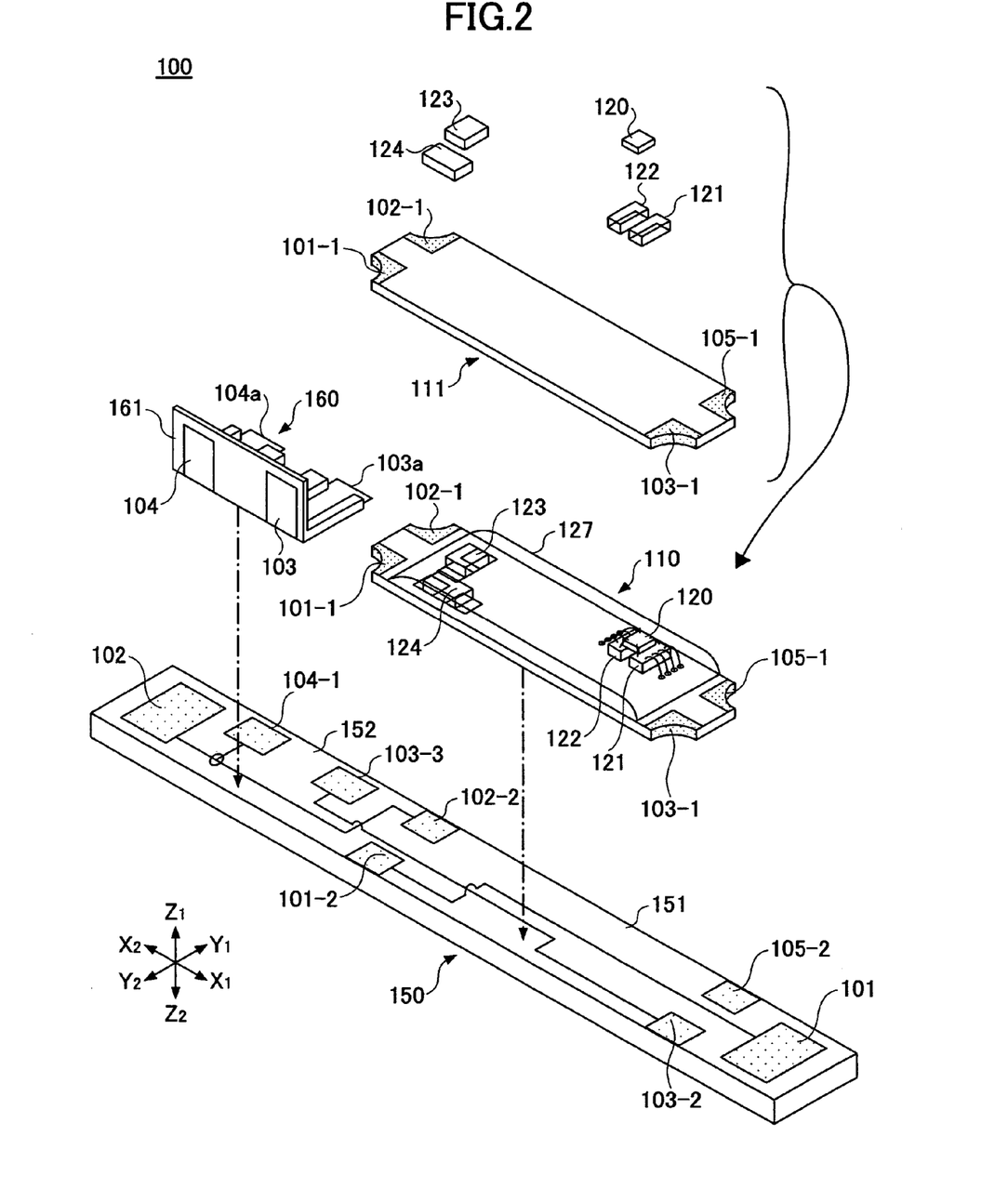
FIG. 2 is a perspective view illustrating the battery protection device of FIG. 1.
Figure 3:
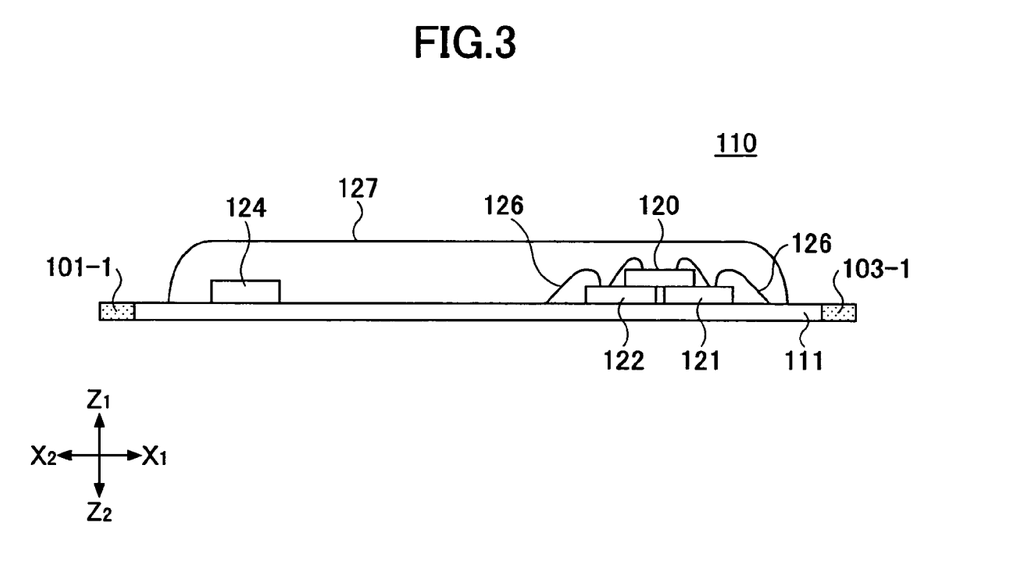
FIG. 3 is a front cross-sectional view illustrating the battery protection module according to the first embodiment of the present invention.
Figure 8:
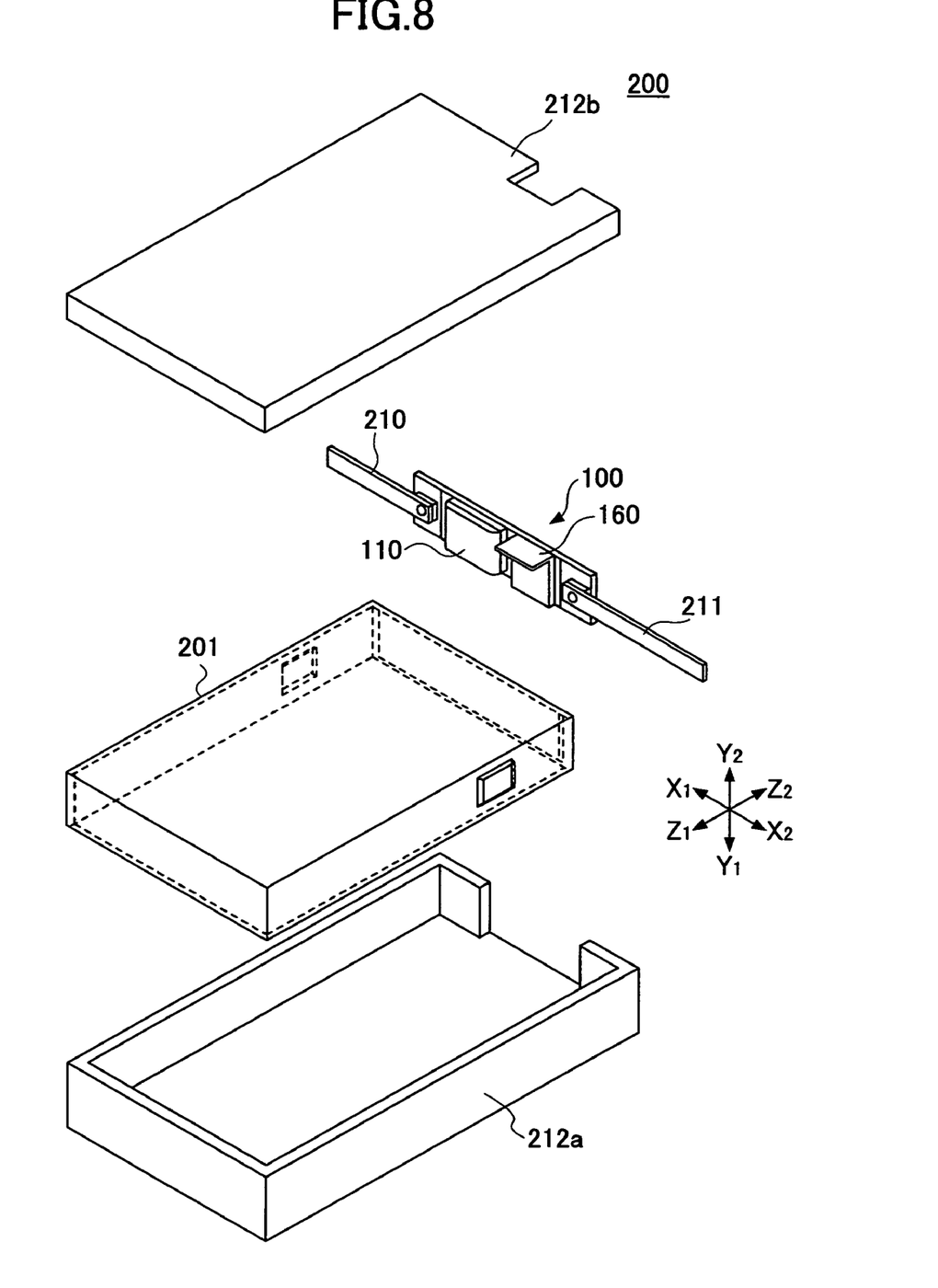
FIG. 8 is a perspective view illustrating a battery pack including the battery protection device of FIG. 1.
Figure 9:
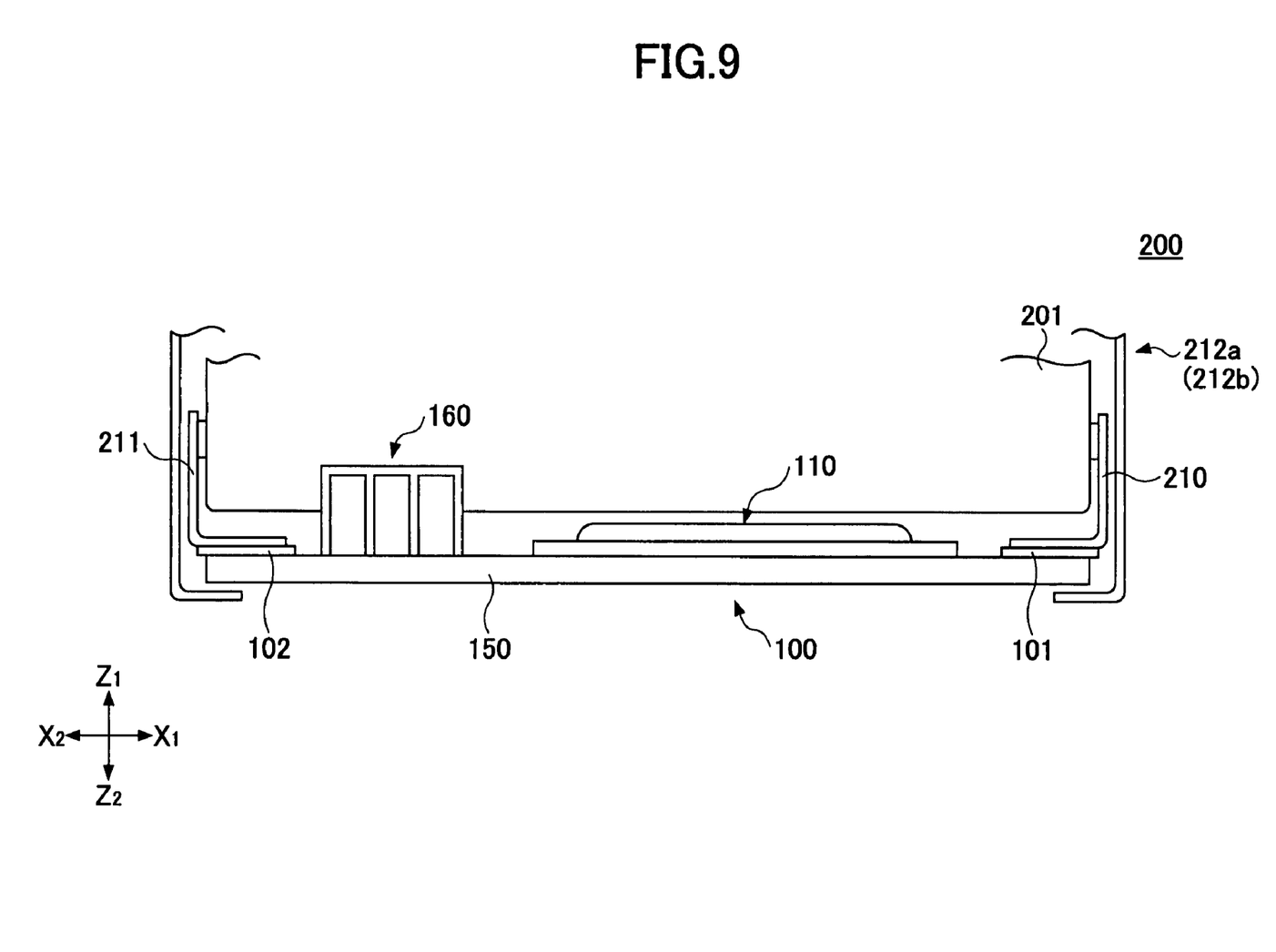
FIG. 9 is an enlarged view illustrating the battery protection device of the battery pack of FIG. 8.
Figure 10:
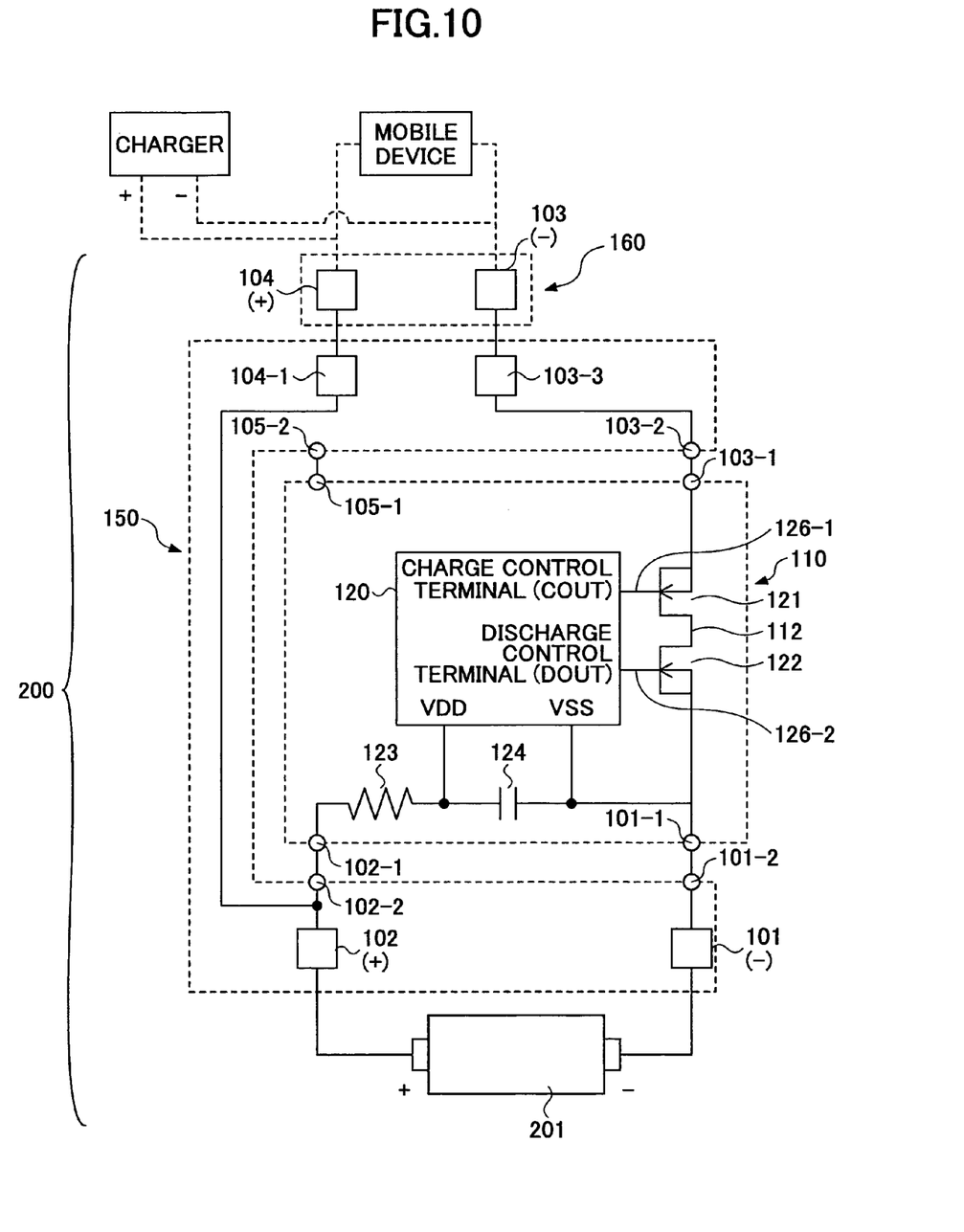
FIG. 10 is a circuit diagram of the battery protection device of FIG. 1.

FIGS. 1 and 2 illustrate a battery protection device 100 according to a first embodiment of the present invention. FIG. 3 illustrates a COB type battery protection module 110. FIG. 8 and FIG. 9 illustrate a battery pack 200 in which the battery protection device 100 connected to a lithium-ion battery 201 is installed. In FIGS. 8 and 9, Z1 indicates an inner side of the battery pack 200, and Z2 indicates a front side of the battery pack 200. X1-X2 indicates a length direction of the battery protection device 100; Y1-Y2 indicates a width direction thereof; and Z1-Z2 indicates a thickness direction thereof. The Z1 side of the battery protection device 100 is the upper side, and the Z2 side thereof is the lower side. FIG. 10 is a circuit diagram of the battery protection device 100.

Referring to FIGS. 1 and 2, the battery protection device 100 comprises a battery protection module 110, a base printed board 150, and a connector member 160. The battery protection module 110 and the connector member 160 are mounted on the base printed board 150. The circuit diagram of the battery protection device 100 illustrated in FIG. 10 shows a circuit section of the battery protection module 110 and a circuit section of the base printed board 150 in separate dashed-line boxes.

Taking a look at terminals, the battery protection device 100 includes a battery negative terminal 101 connected to the lithium-ion battery 201, a battery positive terminal 102 also connected to the lithium-ion battery 201, a battery pack negative output terminal 103, and a battery pack positive output terminal 104. The terminals 101 through 104 are connected to terminals of the battery protection module 110 via wiring and terminals, which are described in greater detail below.

[Battery Protection Module 110]

Referring to FIGS. 2 and 3, in the battery protection module 110, a control IC chip 120 serving as a battery protection IC chip, a first FET-SW chip 121, a second FET-SW chip 122, a resistance chip 123, and capacitor chip 124 are disposed on a Z1-side face of a COB-compatible printed board 111 having a double-sided structure.

Figure 4A:
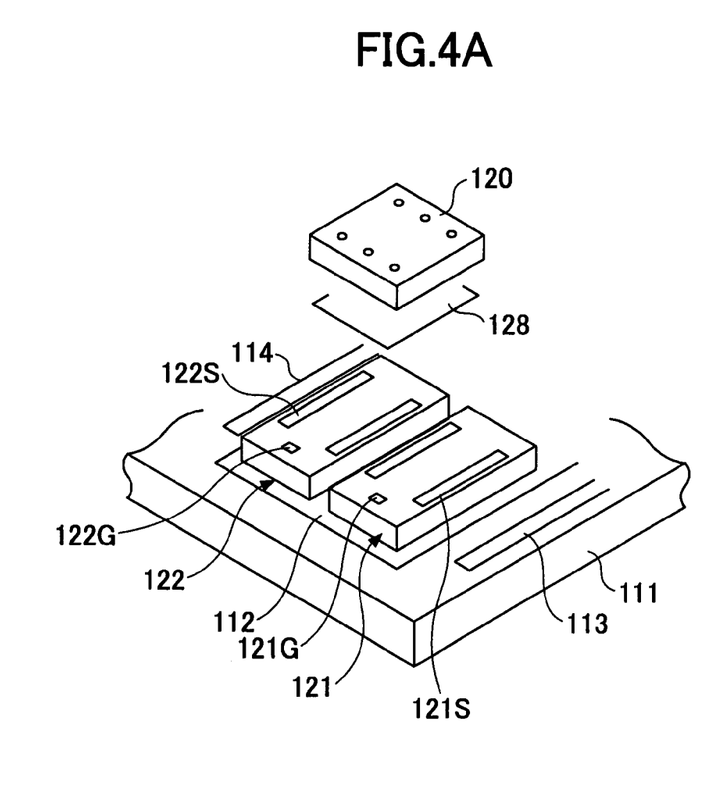
FIGS. 4A and 4B are enlarged views each illustrating a control IC chip mounted on first and second FET-SW chips.
Figure 4B:
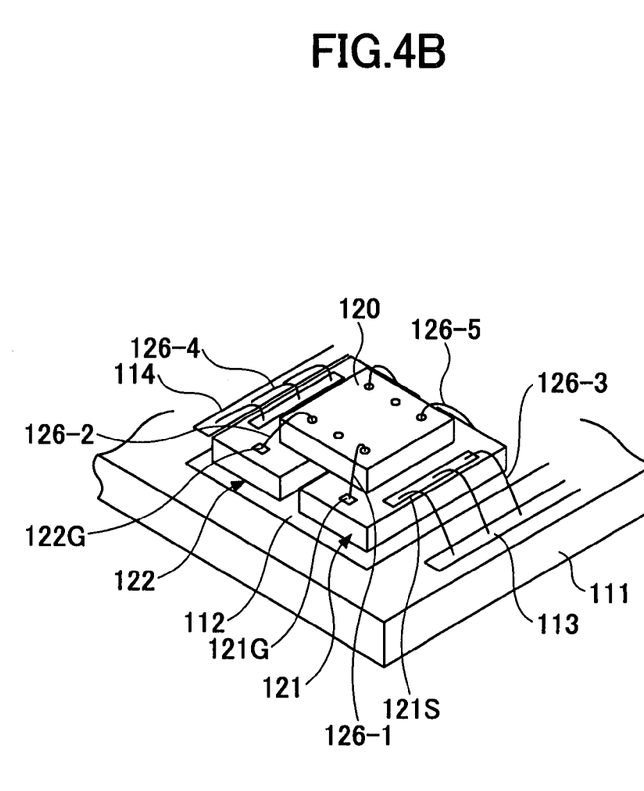

Referring to FIGS. 4A and 4B, the first and second FET-SW chips 121 and 122 have gate terminals 121G and 122G and source terminals 121S and 122S disposed on upper faces, and have drain terminals (not shown) disposed on the entire surfaces of lower faces, respectively. The first and second FET-SW chips 121 and 122 are mounted side-by-side on a die pad 112. The drain terminals are silver-pasted onto the die pad 112 formed on the printed board 111. The control IC chip 120 is secured onto the adjacent first and second FET-SW chips 121 and 122 with a double-sided adhesive tape 128 so as to extend across the first and second FET-SW chips 121 and 122. Because the area of the control IC chip 120 is smaller than the total area of the adjacent first and second FET-SW chips 121 and 122, the gate terminals 121G and 122G and the source terminals 121S and 122S are exposed outside the control IC chip 120. An Au wire 126-1 extends between the control IC chip 120 and the first FET-SW chip 121. An end of the Au wire 126-1 is bonded to a terminal disposed on an upper face of the control IC chip 120, while the other end is bonded to the gate terminal 121G of the first FET-SW chip 121. Likewise, an Au wire 126-2 extends between the control IC chip 120 and the second FET-SW chip 122. An end of the Au wire 126-2 is bonded to a terminal disposed on the upper face of the control IC chip 120, while the other end is bonded to the gate terminal 122G of the second FET-SW chip 122. Plural Au wires 126-3 are bonded at one end to the source terminal 121S of the first FET-SW chip 121 and at the other end to a pad 113 on the printed board 111. Likewise, plural Au wires 126-4 are bonded at one end to the source terminal 122S of the second FET-SW chip 122 and at the other end to a pad 114 on the printed board 111. An Au wire 126-5 is bonded at one end to another terminal disposed on the upper face of the control IC chip 120 and at the other end to a pad on the printed board 111.

Referring to FIG. 3, the control IC chip 120, the first and second FET-SW chips 121 and 122, the resistance chip 123 (hidden from view in FIG. 3), and the capacitor chip 124 disposed on the Z1-side face of the printed board 111 are encapsulated by a synthetic resin part 127. Together with the control IC chip 120 arranged on the first and second FET-SW chips 121 and 122, the Au wires 126-1 through 126-5 are encapsulated by the synthetic resin part 127.

The control IC chip 120, the first and second FET-SW chips 121 and 122, the resistance chip 123, and the capacitor chip 124 are connected to form a lithium-ion protection circuit shown in FIG. 10.

[Control IC Chip 120]

Referring to FIG. 10, the control IC chip 120 provides an overcharge detection function to turn off the first FET-SW chip 121 when an overvoltage is applied to the lithium-ion battery 201 due to some failure during charging, an overdischarge detection function to turn off the second FET-SW chip 122 when the voltage of the lithium-ion battery 201 drops to or below a predetermined voltage, an overcurrent detection function to turn off the first FET-SW chip 121 when a large current is applied due to a short circuit, and a temperature detection function to detect whether a temperature, such as ambient temperature or the temperature of one or more of the first and second FET-SW chips 121 and 122, rises to a predetermined temperature.

Figure 5:
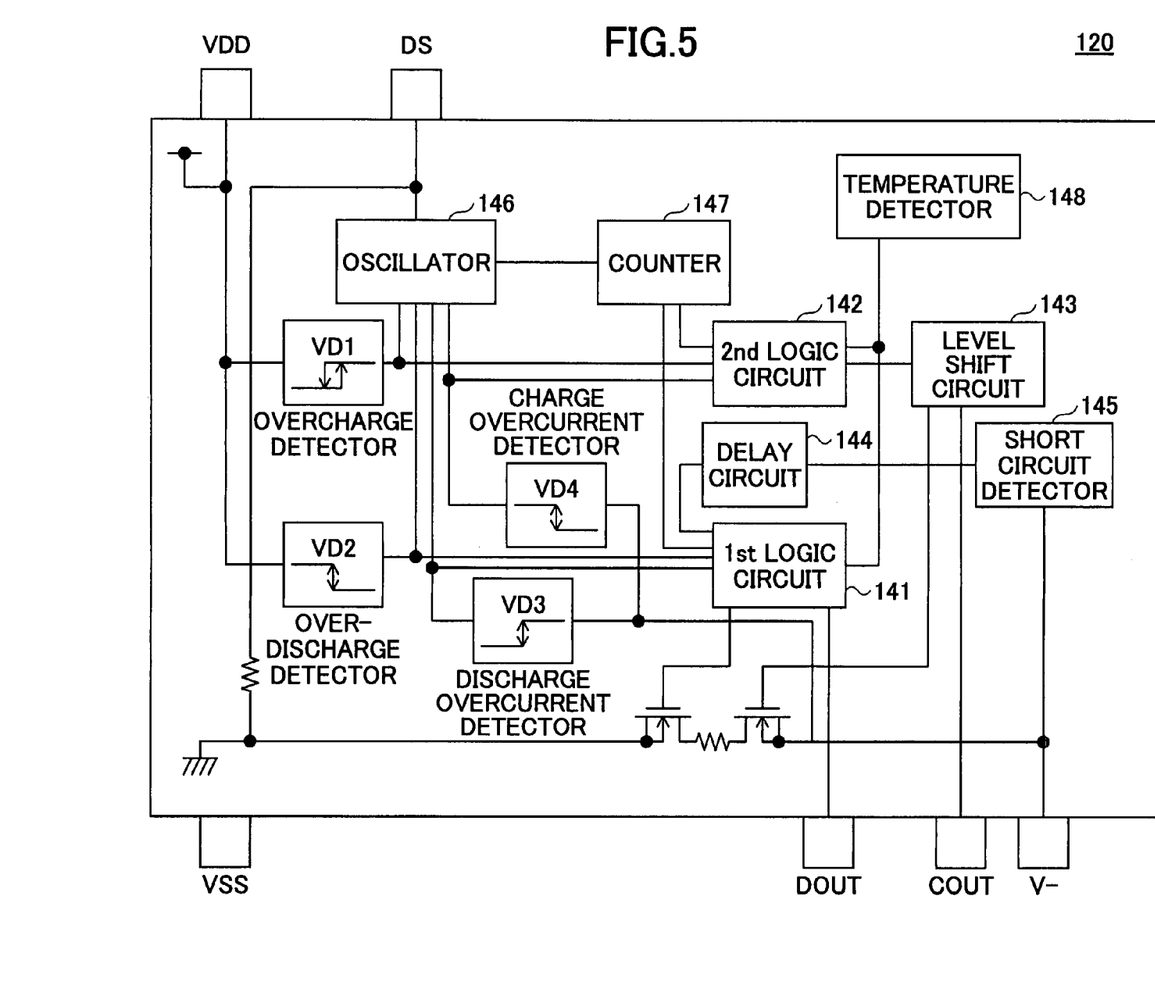
FIG. 5 is a block circuit diagram of a control IC chip.

For providing these functions, as shown in FIG. 5, the control IC chip 120 includes a first logic circuit 141, a second logic circuit 142, an overcharge detector VD1, an overdischarge detector VD2, a discharge overcurrent detector VD3, charge overcurrent detector VD4, a level shift circuit 143, a delay circuit 144, a short circuit detector 145, an oscillator 146, a counter 147, and a temperature detector 148 which constitutes a part of the present invention. The control IC chip 120 further includes a charge control terminal COUT, a discharge control terminal DOUT, a VDD terminal, a VSS terminal, a DS terminal, and a V negative terminal V−. The temperature detector 148 is connected to the first logic circuit 141 and the second logic circuit 142. The first logic circuit 141 and the second logic circuit 142 are connected to the charge control terminal COUT and the discharge control terminal DOUT, respectively.

Figure 6:
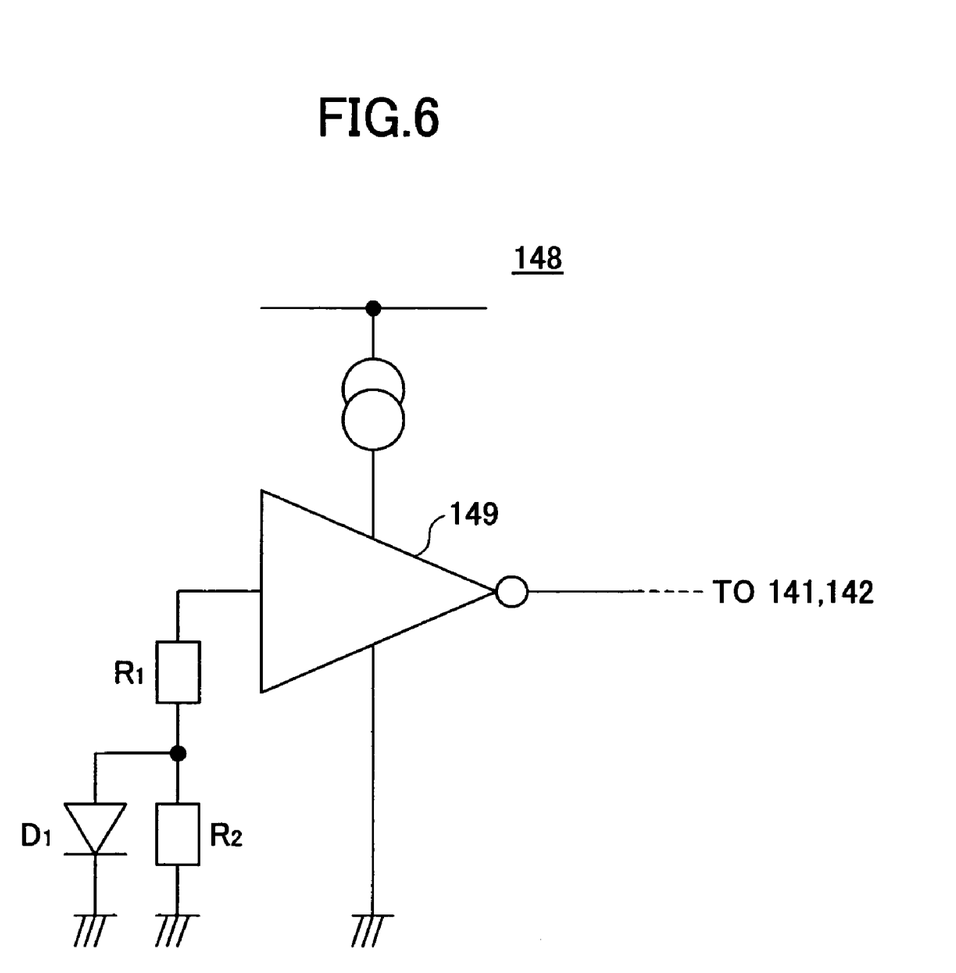
FIG. 6 is a circuit diagram of a temperature detector of FIG. 5.
Figure 7A:
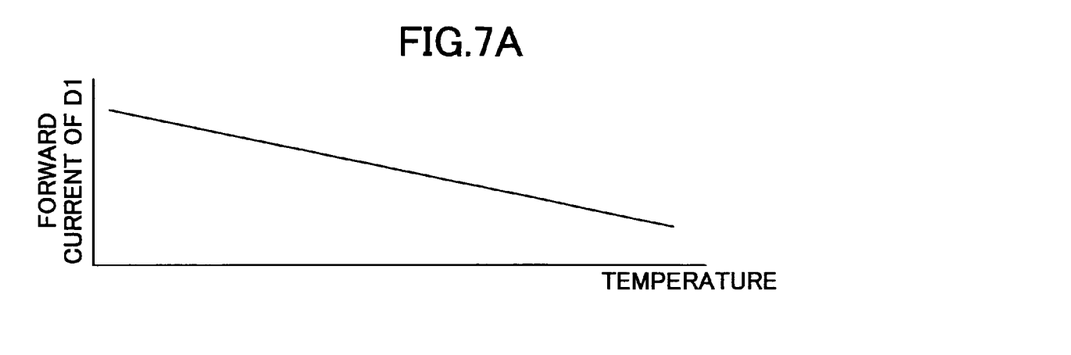
FIGS. 7A-7C are graphs for illustrating operations of the temperature detector of FIG. 6.

The temperature detector 148 is configured to utilize a negative temperature characteristic of a diode D1 illustrated in FIG. 7A. As shown in FIG. 6, the temperature detector 148 includes an inverter 149, resistance elements R1 and R2, and the diode D1. The resistance elements R1 and R2 and the diode D1 are disposed at the input side of the inverter 149. The inverter 149 has a threshold SH. The threshold SH is set based on a temperature T1 to be detected and the temperature characteristic of the diode D1. The inverter 149 is connected to the first logic circuit 141 and the second logic circuit 142.

When the temperature of the diode D1 is lower than the predetermined temperature T1, an input voltage of the inverter 149 is high, and an output of the inverter 149 is "L". Outputs of the first logic circuit 141 and the second logic circuit 142 are "H", and potentials of the charge control terminal COUT and the discharge control terminal DOUT are "H".

Figure 7B:
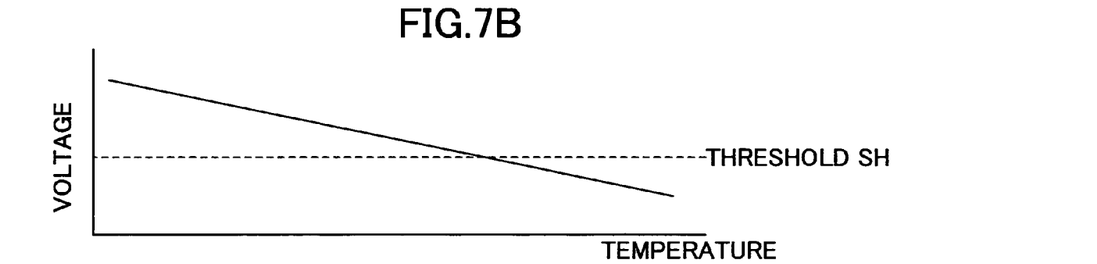
Figure 7C:
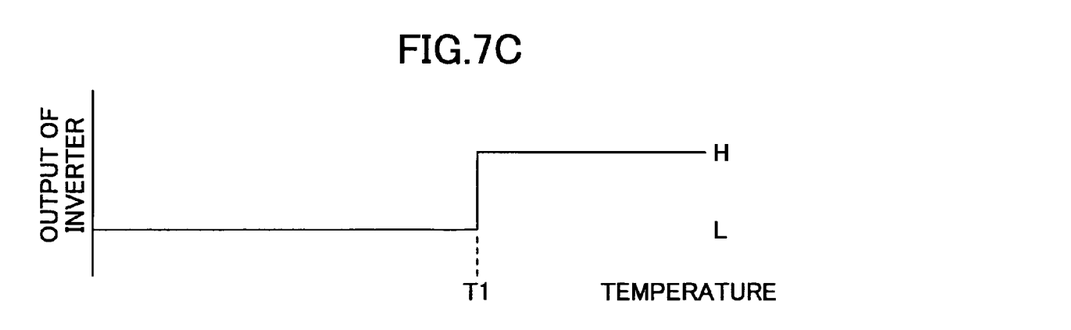

As the temperature of the diode D1 rises, a forward current of the diode D1 lowers as shown in FIG. 7A. Accordingly, the input voltage of the inverter 149 lowers as shown in FIG. 7B. When the temperature exceeds the predetermined temperature T1, the input voltage of the inverter 149 falls below the threshold SH. In response, the output of the inverter 149 is inverted into "H". When the output of the inverter 149 is inverted into "H", the outputs of the first logic circuit and the second logic circuit 142 are switched to "L", and the potentials of the charge control terminal COUT and the discharge control terminal DOUT are switched to "L". Thus, both the first and second FET-SW chips 121 and 122 are turned off.

[Battery Protection Device 100]

Referring back to FIG. 1, the battery protection module 110 is mounted on a battery protection module mount section 151 (FIG. 2) of the base printed board 150. The terminals 101-1, 102-1, 103-1, and 105-1 disposed at the corners of the battery protection module 110 are soldered to the corresponding terminals 101-2, 102-2, 103-2, and 105-2 of the base printed board 150. The connector member 160 is bonded to a connector member mount section 152 (FIG. 2). An end 103a of the battery pack negative output terminal 103 and an end 104a of the battery pack positive output terminal 104 are connected to the corresponding terminals 103-3 and 104-1 (FIG. 2).

Referring to FIG. 8, terminal strips 210 and 211 are connected to the terminals 101 and 102 of the battery protection device 100, respectively. Referring then to FIG. 9, outer ends of the terminal strips 210 and 211 are connected to corresponding electrodes of the lithium-ion battery 201, so the battery protection device 100 is attached on a side face of the lithium-ion battery 201. The lithium-ion battery 201 with the battery protection device 100 attached is assembled in cases 212a and 212b. Thus, the battery pack 200 is completed.

[Overcurrent of Battery Pack 200]

When the battery pack 200 of FIG. 8 is used, the battery pack 200 is attached to a mobile device to be electrically connected to the mobile device through the battery pack negative output terminal 103 and the battery pack positive output terminal 104. If a voltage of the lithium-ion battery 201 drops to or below a predetermined voltage and therefore the lithium-ion battery 201 is overdischarged, the second FET-SW chip 122 is turned off. If a large current is applied due to some failure such as a short circuit, the first FET-SW chip 122 is turned off.

When the battery pack 200 of FIG. 8 is charged, the battery pack 200 is placed on a recharger to be electrically connected to the recharger through the battery pack negative output terminal 103 and the battery pack positive output terminal 104. If a large current is applied to the lithium-ion battery 201 due to some failure during charging and therefore the lithium-ion battery 201 is overcharged, the first FET-SW chip 121 is turned off to protect the lithium-ion battery 201.

If a large current is applied between the terminal 101 and the terminal 103 shown in FIG. 10 and results in an overcurrent, the following operations are also performed.

When a large current is applied from the terminal 103 to the terminal 101 during charging, the first and second FET-SW chips 121 and 122 generate heat. The heat of the first and second FET-SW chips 121 and 122 is transferred to the control IC chip 120. When the temperature detected by the temperature detector 148 exceeds the predetermined temperature, the input voltage of the inverter 149 exceeds the threshold. In response, the output of the inverter 149 is inverted into "H". The outputs of the first logic circuit and the second logic circuit 142 are switched to "L", and the potentials of the charge control terminal COUT and the discharge control terminal DOUT are switched to "L". Thus, both the first and second FET-SW chips 121 and 122 are turned off. A path between the terminal 103 and the terminal 101 is cut in this way, thereby protecting the lithium-ion battery 201 and preventing overheating of the battery protection device 100. If a large current is applied from the terminal 103 to the terminal 101 during discharging, the same operations are performed to turn off both the first and second FET-SW chips 121 and 122. This protects the mobile device and prevents overheating of the battery protection device 100, especially overheating of the first and second FET-SW chips 121 and 122.

Second Embodiment

In a second embodiment, the control IC chip 120 and the first and second FET-SW chips 121 and 122 of the first embodiment are integrated into one module.

Figure 11:
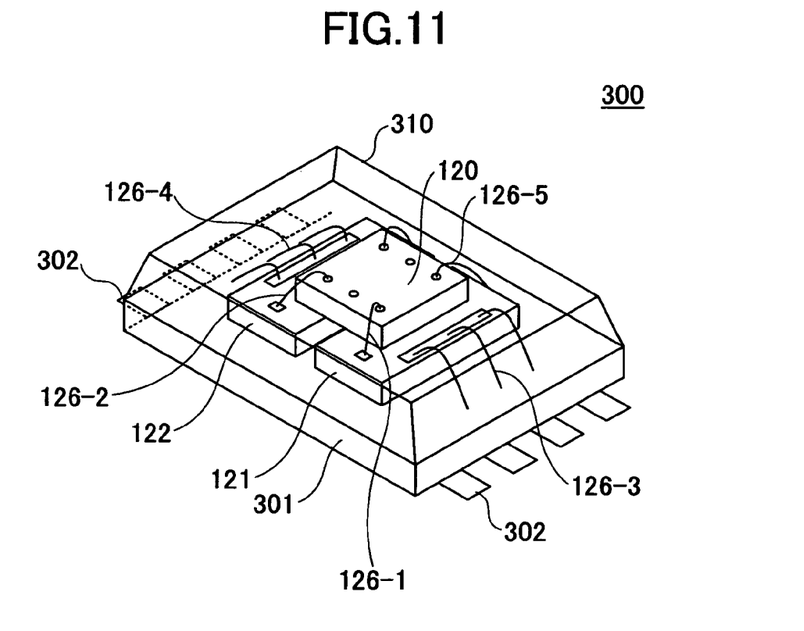
FIG. 11 is an enlarged perspective view illustrating a control IC chip module according to a second embodiment of the present invention.

FIG. 11 shows a control IC chip module 300 serving as a battery IC chip module. In the control IC chip module 300, first and second FET-SW chips 121 and 122 are mounted side-by-side on a board 301 having terminals 302. A control IC chip 120 is secured onto the adjacent first and second FET-SW chips 121 and 122 with a double-sided adhesive tape so as to extend across the first and second FET-SW chips 121 and 122. Au wires 126-1 through 126-5 are provided with their ends bonded. The control IC chip 120, the first and second FET-SW chips 121 and 122, and the Au wires 126-1 through 126-5 are encapsulated by a synthetic resin part 310.

Figure 12:
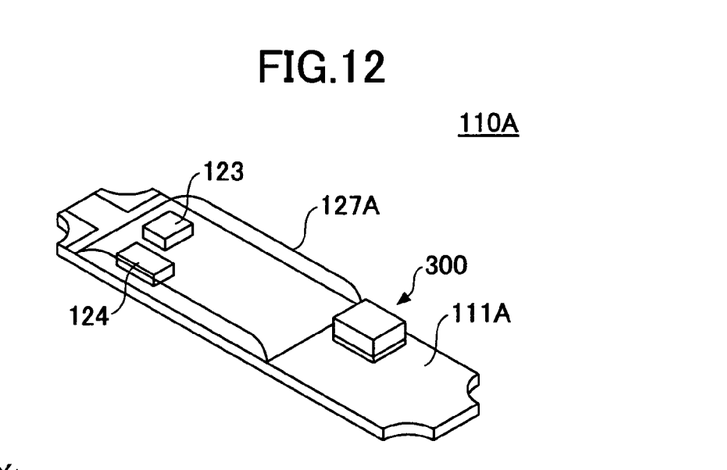
FIG. 12 is a perspective view illustrating the control IC chip module of FIG. 11.
Figure 13:
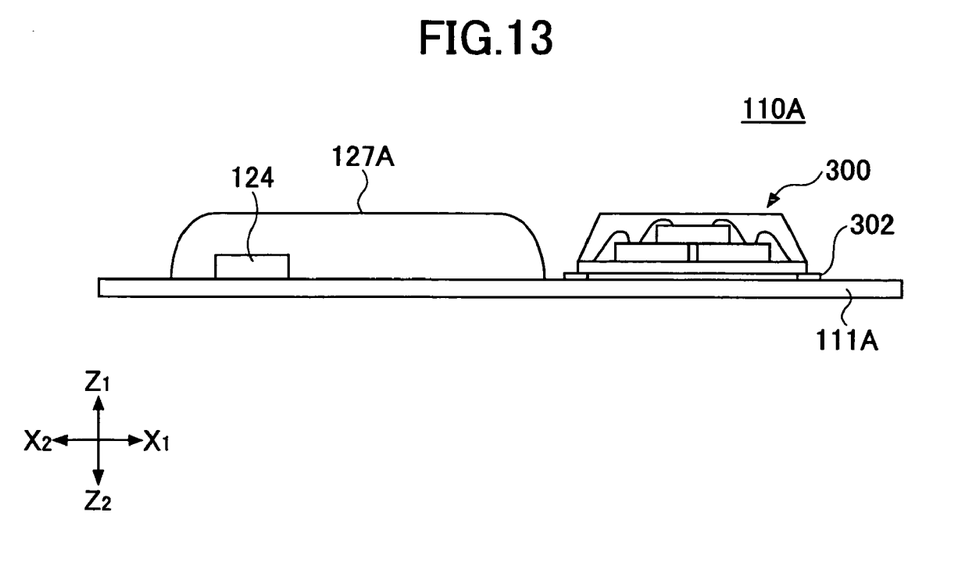
FIG. 13 is a cross-sectional view illustrating the battery protection module of FIG. 12.

Referring to FIGS. 12 and 13, the control IC chip module 300 is mounted on a COB-compatible printed board 111A together with a resistance chip 123 and a capacitor chip 124. The resistance chip 123 and the capacitor chip 124 are encapsulated by a synthetic resin part 127A. In this way, a battery protection module 110A is formed.

In place of the independent first and second FET-SW chips 121 and 122, a part integrally comprising the first and second FET-SW chips 121 and 122 arranged side-by-side may be used.

The present application is based on Japanese Priority Application No. 2005-020213 filed on Jan. 27, 2005, with the Japanese Patent Office, the entire contents of which are hereby incorporated by reference.

What is claimed is:

1. A battery protection IC chip, comprising:
    a protection section for protecting a battery during charging and discharging; and
    a temperature detector for detecting an ambient temperature, the temperature detector including a diode and an inverter having a threshold SH based on a predetermined temperature T1 and a negative temperature characteristic of the diode, wherein the diode is connected to an input of the inverter via a resistance, and when the temperature of the diode is lower than the predetermined temperature T1, an input voltage of the inverter is above the threshold SH and an output of the inverter is low L because of the negative temperature characteristic of the diode, and when the temperature of the diode is higher than the predetermined temperature T1, the input voltage of the inverter falls below the threshold SH and the output of the inverter is high H because of the negative temperature characteristic of the diode;
    wherein the protection section is configured to turn off a charge control FET chip and a discharge control FET chip in response to a detection by the temperature detector indicating that the output of the inverter is high H.

2. A battery protection IC chip module, comprising:
    a charge control FET chip;
    a discharge control FET chip; and
    a battery protection IC chip including a protection section for protecting a battery during charging and discharging, and
    a temperature detector for detecting an ambient temperature, the protection section being configured to turn off the charge control FET chip and the discharge control FET chip in response to a detection by the temperature detector of the ambient temperature reaching a predetermined temperature, the temperature detector including a diode and an inverter having a threshold SH based on a redetermined temperature T1 and a negative temperature characteristic of the diode, wherein the diode is connected to an input of the inverter via a resistance and when the temperature of the diode is lower than the predetermined temperature T1, an input voltage of the inverter is above the threshold SH and an output of the inverter is low L because of the negative temperature characteristic of the diode, and when the temperature of the diode is higher than the predetermined temperature T1, the input voltage of the inverter falls below the threshold SH and the output of the inverter is high H because of the negative temperature characteristic of the diode;
    wherein the charge control FET chip and the discharge control FET chip are aligned side-by-side and mounted on a board;
    the battery protection IC chip is mounted on the charge control FET chip and the discharge control FET chip adjacent to and extending across the charge control FET chip and the discharge control FET chip and not in contact with the board;

the charge control FET chip, the discharge control FET chip, and the battery protection IC chip are encapsulated by a synthetic resin part; and the board includes a terminal for mounting.

3. A battery protection module, comprising;

a resistance chip;

a capacitor chip;

a charge control FET chip;

a discharge control FET chip; and a battery protection IC chip that is mounted on upper faces of the charge control FET chip and the discharge control FET chip, including a protection section for protecting a battery during charging and discharging, and a temperature detector for detecting an ambient temperature, the protection section being configured to turn off the charge control FET chip and the discharge control FET chip in response to a detection by the temperature detector of the ambient temperature reaching a predetermined temperature;

the temperature detector including a diode and an inverter having a threshold SH based on a predetermined temperature T1 and a negative temperature characteristic of the diode, wherein the diode is connected to an input of the inverter via a resistance and when the temperature of the diode is lower than the predetermined temperature T1 an input voltage of the inverter is above the threshold SH and an output of the inverter is low L because of the negative temperature characteristic of the diode, and when the temperature of the diode is higher than the predetermined temperature T1, the input voltage of the inverter falls below the threshold SH and the output of the inverter is high H because of the negative temperature characteristic of the diode;

the resistance chip, the capacitor chip, the charge control FET chip, and the discharge control FET chip aligned with respect to the charge control FET chip are mounted on a printed board;

wherein the charge control FET chip and the discharge control FET chip are aligned side-by-side on the printed board;

the battery protection IC chip being mounted on the charge control FET chip and the discharge control FET chip adjacent to and extending across the charge control FET chip and the discharge control FET chip and not in contact with the board;

the resistance chip, the capacitor chip, the charge control FET chip, the discharge control FET chip, and the battery protection IC chip constitute a battery protection circuit; and the resistance chip, the capacitor chip, the charge control FET chip, the discharge control FET chip, and the battery protection IC chip are encapsulated by a synthetic resin part.

4. A battery protection module, comprising;

a resistance chip;

a capacitor chip; and the battery protection IC chip module of claim 2;

wherein the resistance chip, the capacitor chip, and the battery protection IC chip module are mounted on a printed board and constitute a battery protection circuit.

* * * * *